United States Patent [19]
Adrian

[11] Patent Number: 5,977,599
[45] Date of Patent: Nov. 2, 1999

[54] FORMATION OF A METAL VIA USING A RAISED METAL PLUG STRUCTURE

[75] Inventor: Ng Choon Seng Adrian, Singapore, Singapore

[73] Assignee: Chartered Semiconductor Manufacturing, Singapore, Singapore

[21] Appl. No.: 09/157,511

[22] Filed: Sep. 21, 1998

Related U.S. Application Data

[62] Division of application No. 08/638,657, Apr. 29, 1996, Pat. No. 5,843,839.

[51] Int. Cl.$^6$ .............................. H01L 23/48; H01L 23/52; H01L 29/40
[52] U.S. Cl. ........................ 257/382; 257/750; 257/752; 257/758
[58] Field of Search ..................... 257/774, 773, 257/382, 758, 750, 752, 211

[56] References Cited

U.S. PATENT DOCUMENTS

| | | | |
|---|---|---|---|
| 4,884,123 | 11/1989 | Dixit et al. | 257/774 |
| 4,917,759 | 4/1990 | Fisher et al. | 156/643 |
| 5,177,589 | 1/1993 | Kobayashi et al. | 257/774 |
| 5,262,354 | 11/1993 | Cote et al. | 437/195 |
| 5,279,988 | 1/1994 | Saadat et al. | 437/195 |
| 5,312,512 | 5/1994 | Allman et al. | 156/636 |
| 5,332,924 | 7/1994 | Kobayashi | 257/760 |
| 5,341,026 | 8/1994 | Harada et al. | 257/764 |
| 5,459,345 | 10/1995 | Okudaira et al. | 257/310 |
| 5,679,981 | 10/1997 | Kuwajima | 257/752 |
| 5,691,571 | 11/1997 | Hirose et al. | 257/751 |

*Primary Examiner*—Mahshid Saadat
*Assistant Examiner*—Jesse A. Fenty
*Attorney, Agent, or Firm*—George O. Saile; Rosemary L.S. Pike

[57] ABSTRACT

A process has been developed which allows contact between levels of interconnect metallization structures, to occur without the use of via holes, etched in interlevel insulator layers. The process features creation of a raised tungsten plug structure, used to provide contact between underlying active device regions and an overlying interconnect metallization structure. The tungsten plug structure is formed by photolithographic masking and dry etching procedures, thus avoiding increasing the size of a tungsten seam, in the center of the plug structure. In addition the tungsten definition process, also results in a raised plug structure, allowing subsequent contact of interconnect metallization levels to proceed without the use of etched via holes in interlevel insulator layers.

4 Claims, 7 Drawing Sheets

FORMATION OF A METAL VIA USING A RAISED METAL PLUG STRUCTURE

This application, Ser. No. 09/157,511, is a divisional application of a parent application 08/638.657, filed Apr. 29, 1996, which has been issued as a patent, U.S. Pat. No. 5,843,839, on Dec. 1, 1998.

BACKGROUND OF THE INVENTION (1) Field of the Invention

This invention relates to the fabrication processes use to create semiconductor devices, and more specifically to methods used to create metal via structures, used to interconnect overlying and underlying metallization levels.

(2) Background of the Invention

The semiconductor industry is continually striving to increase the performance of semiconductor devices, while still maintaining, or decreasing, the manufacturing cost of these same semiconductor devices. These objectives have been successfully addressed by the ability of the semiconductor fabrication community to successfully create silicon devices with specific sub-micron features. The advent of micro-miniaturization, or the use of sub-micron features, has largely been accomplished by advances in several semiconductor fabrication disciplines, specifically photolithography and anisotropic dry etching. The development of more sophisticated exposure cameras, as well as the use of more sensitive photoresist materials, have resulted in sub-micron images in photoresist layers being routinely obtained. In addition similar advances in dry etching, or reactive ion etching, (RIE), have allowed the sub-micron images in photoresist layers, to be successfully transferred to underlying materials, used for the construction of silicon devices. The use of sub-micron features results in decreases in parasitic capacitances, as well as resistance decreases, both providing performance benefits. In addition the smaller features allow a greater number of smaller silicon chips to be obtained from a specific size starting wafer, thus reducing the manufacturing cost for individual chips.

The use of semiconductor chips, fabricated with sub-micron features, does however create specific areas of concern, not encountered with semiconductor chips, fabricated with less aggressive designs. For example, metal filled via holes, used to interconnect metallization levels, are more difficult to form when using sub-micron designs. Via holes, with sub micron diameters, are also difficult to fill with conventional metallization deposition techniques, such as sputtering or evaporation. The high aspect ratio of the via hole, that is the depth of the via, divided by the diameter of the via opening, requires a low pressure chemical vapor deposition, (LPCVD) process for adequate via hole filling. Since it is difficult to deposit aluminum based metallizations, using LPCVD, the semiconductor industry has used LPCVD tungsten to fill these high aspect ratio via holes. However even with the use of LPCVD tungsten, several shortcomings still exist. For example since the LPCVD fill of a via hole proceeds by tungsten depositing on the sides of the via hole, a seam or imperfection can exist in the center of the tungsten filled via, at the point of convergence of the depositing layers. This seam, when subjected to RIE etch back processes, used to remove unwanted tungsten from areas of the silicon device, other than the via hole, can evolve into a larger seam or defect, making it difficult for subsequent overlying metallizations to successfully cover. Thus overlying metallizations, thin in areas overlying the enlarged seam, may experience higher current densities than desired, and possibly resulting in electromigration failure.

This invention will describe a process for creating metal vias, or studs, using a chemically vapor deposited tungsten layer, to fill a narrow contact hole, or via hole opening, in a dielectric layer. However, to avoid expanding the existing seam in the tungsten fill, a photolithographic and reactive ion etching procedure, is used to remove unwanted tungsten from areas outside the contact or via hole vicinity. These process steps, unlike a blanket etchback, will not allow the narrow seam in the tungsten fill to evolve into a more deleterious fault, in areas where the via is directly over the contact hole. In addition this approach results in a raised, or extended, tungsten plug structure, that is the top surface of the tungsten plug is higher then the top surface of the dielectric layer, that the contact hole was formed in. A first level interconnect metallization structure, is formed from patterning a metal layer, overlying the extended tungsten plug, and when subjected to subsequent insulator deposition and planarization processes, allow successful contact between overlying second level, and underlying first level metal interconnect structures, without the creation of a via hole. Prior art, such as Cote, et al, in U.S. Pat. No. 5,312,512, suggest filling holes in a dielectric layer with a metal, followed by a chemical mechanical polishing removal procedure. The concept described in this invention, now disclosed, is to create a raised, or extended metal pattern, using a masked, etchback procedure, with the raised, or extended metal structure to be used to allow contact to subsequent overlying interconnect metallization structures, without via hole formation procedures.

SUMMARY OF THE INVENTION

It is an object of this invention to fill narrow diameter, contact or via holes, with a chemically vapor deposited metallization process.

It is another object of this invention to use photolithographic, and dry etching procedures, to remove the unwanted metal, and to create a metal plug. For regions where the via overlies the contact hole, the seams or defects in the metal plug, are not subjected to the dry etching procedure, thus resulting in a raised, or extended metal plug structure, where the top surface of the metal plug structure is higher then the top surface of the insulator material, in which the contact hole was etched.

It is yet another object of this invention to create a first level interconnect metallization structure, overlying the raised metal plug structure.

It is still another object of this invention to use a composite dielectric layer, with a insulator layer such as a spin-on-glass layer, used as part of the composite dielectric layer, to fill the spaces between the first level interconnect metallization structures, and between raised metal plug structures.

It is still yet another object of this invention to planarize the composite dielectric layer, followed by formation of an overlying second level interconnect metallization structure, contacting the underlying first level interconnect metallization structure, without the use of a etched via hole.

In accordance with the present invention a method is described for creating a raised or extended, metal filled contact or via structure, formed by chemical vapor deposition and patterning, using photolithographic and dry etching procedures. A contact hole is formed in an insulator layer, exposing active device regions in an underlying semiconductor substrate. A chemically vapor deposited layer of tungsten is used to completely fill the contact hole. Patterning of the tungsten layer is performed using photolithographic, and dry etching procedures, removing tungsten from unwanted regions, creating a tungsten plug, in the contact hole, with the tungsten plug extending higher than the top surface of the insulator, by an amount that can different or, be equal, to the thickness of the chemically vapor deposited tungsten. A metal layer is deposited and patterned, using photolithographic and dry etching procedures, to create a first level interconnect metallization structure, directly overlying the raised tungsten plug structure. After photoresist removal a composite dielectric layer is used to fill the spaces between first level interconnect metallization structures, and between raised tungsten plug structures. A chemical mechanical polishing procedure is next used for planarization purposes, exposing the top surface of the first level interconnect metallization structure. Another metal layer, is deposited and patterned, using photolithographic and dry etching procedures, creating a second level interconnect metallization structure, contacting the underlying first level interconnect metallization structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of creating raised tungsten plug structures, and the use of this structure in allowing the elimination of a subsequent via hole formation, needed for contact between levels of interconnect metallization structures, will now be covered in detail. This invention can be used in the fabrication of metal oxide semiconductor field effect transistors, (MOSFET), devices, that are currently being manufactured in industry, therefore only specific areas, unique to understanding this invention, will be covered in detail.

Figure 1:
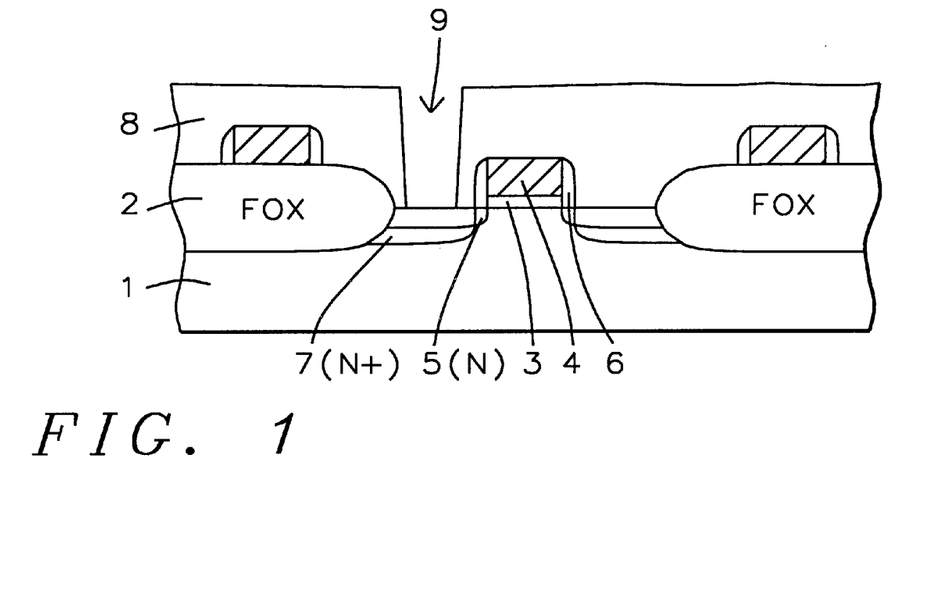
FIG. 1, which schematically shows a silicon device structure, prior to tungsten filling of the contact hole.

FIG. 1, schematically shows a typical, N channel, (NFET), device, that this invention can be applied to. A substrate, 1, composed of single crystalline silicon, with a <100> crystallographic orientation, is used. Thick field oxide regions, (FOX), 2, are created, for isolation purposes. The FOX regions are produced by first patterning a silicon nitride—silicon dioxide, composite insulator, using conventional photolithographic and reactive ion etching, (RIE), procedures. After photoresist removal the composite insulator pattern is used as an oxidation mask to allow between about 4000 to 6000 Angstroms of silicon dioxide to be thermally grown in non-masked regions. After removal of the oxidation masking composite, using hot phosphoric acid for the silicon nitride layer, and a buffered hydrofluoric acid solution for the underlying silicon dioxide layer, a thin silicon oxide layer, 3, is grown at a temperature between about 800 to 1000° C., to a thickness between about 50 to 300 Angstroms, in an oxygen-steam ambient, to serve as the gate insulator of the MOSFET device. A polysilicon layer is next deposited using LPCVD processing, at a temperature between about 500 to 700° C., to a thickness between about 1500 to 4000 Angstroms. The polysilicon can be grown using insitu doping techniques, by adding either arsine or phosphine to a silane ambient. The polysilicon layer can also be deposited intrinsically, and then doped via ion implantation of either arsenic or phosphorous, at an energy between about 50 to 100 Kev., at a dose between about 1E15 to 1E16 atoms/cm$^2$. Standard photolithographic and RIE processing, using $Cl_2$ as an etchant, are used to create polysilicon gate structures, 4, shown schematically in FIG. 1.

After photoresist removal using plasma oxygen ashing and careful wet cleans, an N type, lightly doped source and drain region, 5, is formed in semiconductor substrate, 1, via ion implantation of phosphorous, at an energy between about 30 to 60 Kev., at a dose between about 1E12 to 5E13 atoms/cm$^2$. A silicon oxide layer is next deposited using either LPCVD or plasma enhanced chemical vapor deposition, (PECVD), processing, at a temperature between about 500 to 800° C., to a thickness between about 1500 to 4000 Angstroms, using tetraethylorthosilicate as a source. An anisotropic, RIE procedure, using $CHF_3$ as an etchant, is used to form insulator sidewall spacer, 6, shown schematically in FIG. 1. Another ion implantation procedure, using arsenic at an energy between about 50 to 100 Kev., at a dose between about 1E14 to 5E15 atoms/cm$^2$, is used to create heavily doped, N type, source and drain regions, 7, in semiconductor substrate, 1. Another silicon oxide layer, 8, is deposited using either LPCVD or PECVD processing, at a temperature between about 500 to 800° C., to a thickness between about 5000 to 10000 Angstroms. Silicon oxide layer, 8, is subjected to a chemical mechanical polishing procedure, used to create a planar topography. Photolithographic and RIE procedures, again using $CHF_3$ as an etchant, are next used to open contact hole, 9, exposing the top surface of source and drain region, 7. This is shown schematically in FIG. 1.

Figure 2:
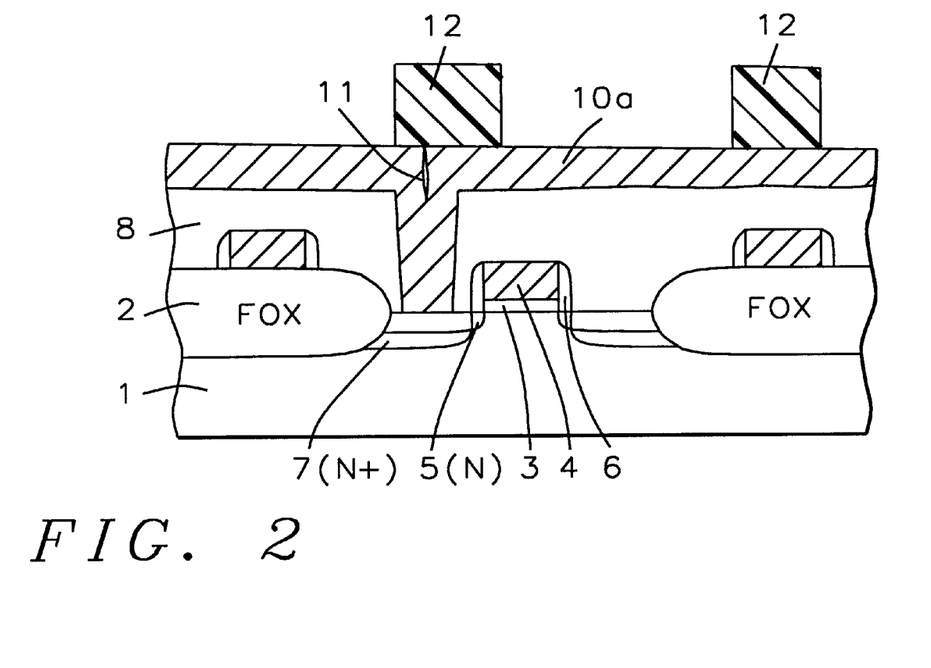
FIGS. 2–3, which schematically show the creation of a raised tungsten plug structure.
Figure 3:
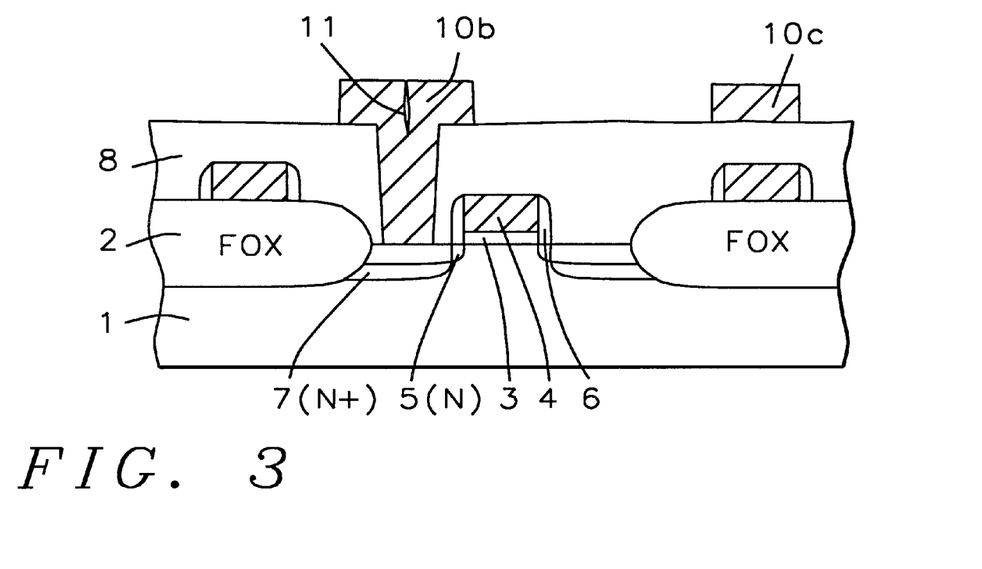

After photoresist removal, using plasma oxygen ashing and careful wet cleans, an LPCVD deposition of tungsten, 10a, is performed, at a temperature between about 400 to 600° C., to a thickness between about 8000 to 14000 Angstroms, completely filling contact hole, 9. Tungsten layer, 10a, shown in FIG. 2, is deposited using tungsten hexafluoride as a source. The filling of contact hole, 9, proceeds by tungsten deposition on the sides of contact hole, 9, and therefore a seam, 11, forms at the point of convergence of the depositing layers. If seam, 11, was subjected to a blanket, dry etching procedure, used to create a tungsten plug by removal of unwanted tungsten from regions outside contact hole, 9, seam, 11, would evolve into a larger seam or void, presenting coverage problems for subsequent overlying metallization layers. Therefore a via mask, in the form of photoresist pattern, 12, is created, and used as a mask for an anisotropic RIE procedure using $SF_6$ as an etchant, creating tungsten plug, 10b, in contact hole, 9, as well as tungsten shape, 10c, to be used for subsequent via structure formation. This can be seen in FIG. 3, after photoresist removal using plasma oxygen ashing and careful wet cleans. Also shown in FIG. 3, is tungsten plug, 10b, raised or extended beyond the top surface of insulator layer, 8, by the amount of the tungsten layer thickness of between about 8000 to 14000 Angstroms. This raised or extended portion of the tungsten plug, will be part of a subsequent first level interconnect metallization structure, that will allow contact to be made to overlying interconnect metallization structures, without having to open via holes in interlevel insulator layers.

Figure 4:
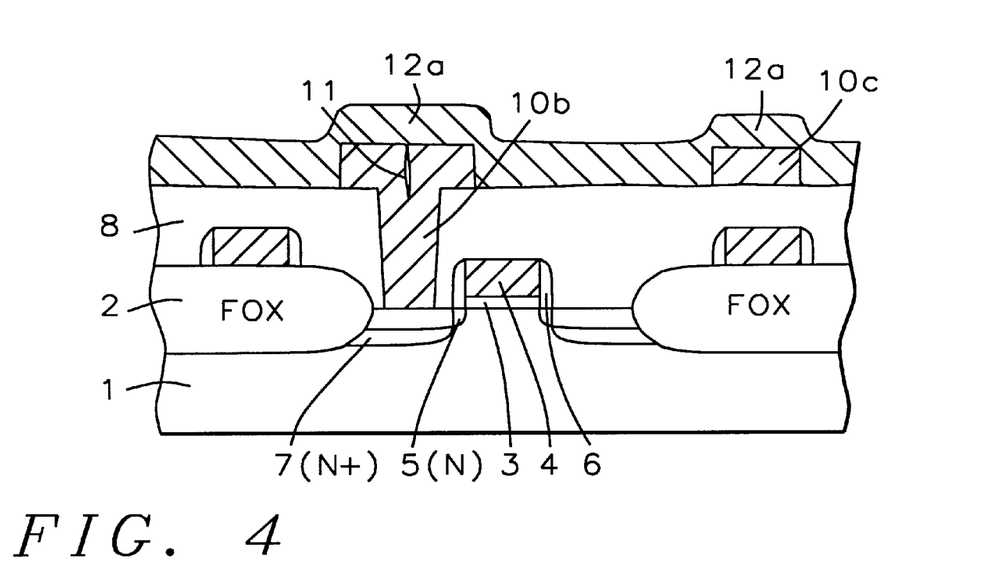
FIGS. 4–6, which schematically show the formation of a first level interconnect metallization structure, directly overlying the raised tungsten plug structure.
Figure 5:
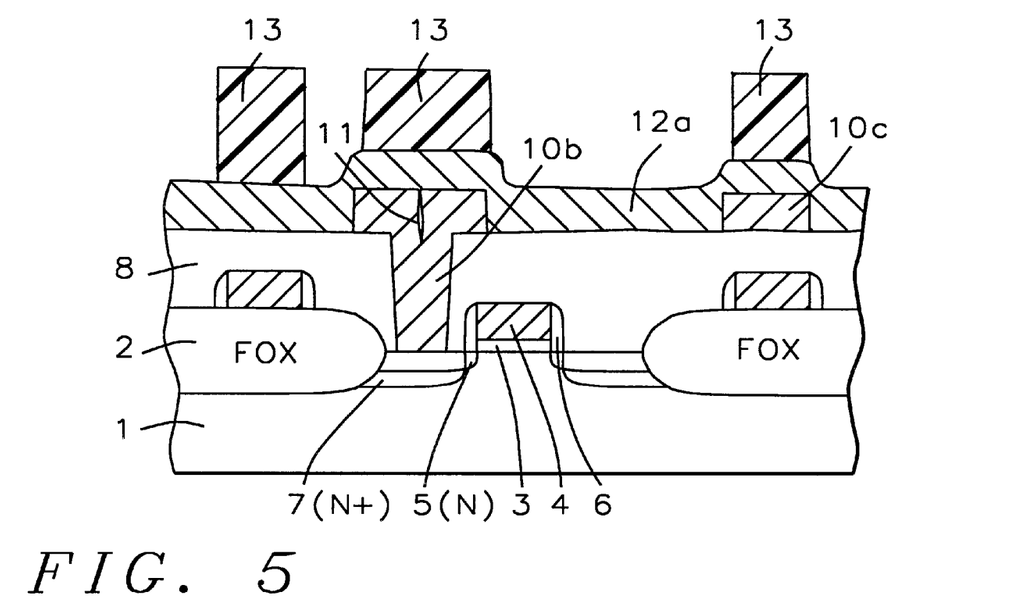

A layer of aluminum, 12a, containing between about 0.5 to 1.0% copper, and between about 0.5 to 1.0% silicon, shown in FIG. 4, is next deposited, using r.f. sputtering, to a thickness between about 4000 to 10000 Angstroms. Photoresist shapes, 13, shown in FIG. 5, are used as mask for anisotropic, RIE processing, using $Cl_2$ and $BCl_3$ as an etchant, and used to create first level interconnect metallization structure, 12b, overlying the raised or extended, tungsten stud, 10b. This is shown schematically in FIG. 6. First level interconnect metallization shapes, 12c, and 12d, also shown in FIG. 6, can be used for subsequent via structure formation. The width of first level interconnect metallization structure, 12b, was chosen, and shown in FIG. 6, to be identical to the width of tungsten plug, 10b. However this invention, of protecting seam, 11, from subsequent dry etching procedures, as well as allowing contact between interconnect metallization structures to occur without the use of etched via holes, can still be applicable with the width of first level interconnect metallization structure, 12b, being either smaller or larger then the width of tungsten plug, 10b. Photoresist shapes, 13, are again removed using plasma oxygen ashing and careful wet cleans.

Figure 7:
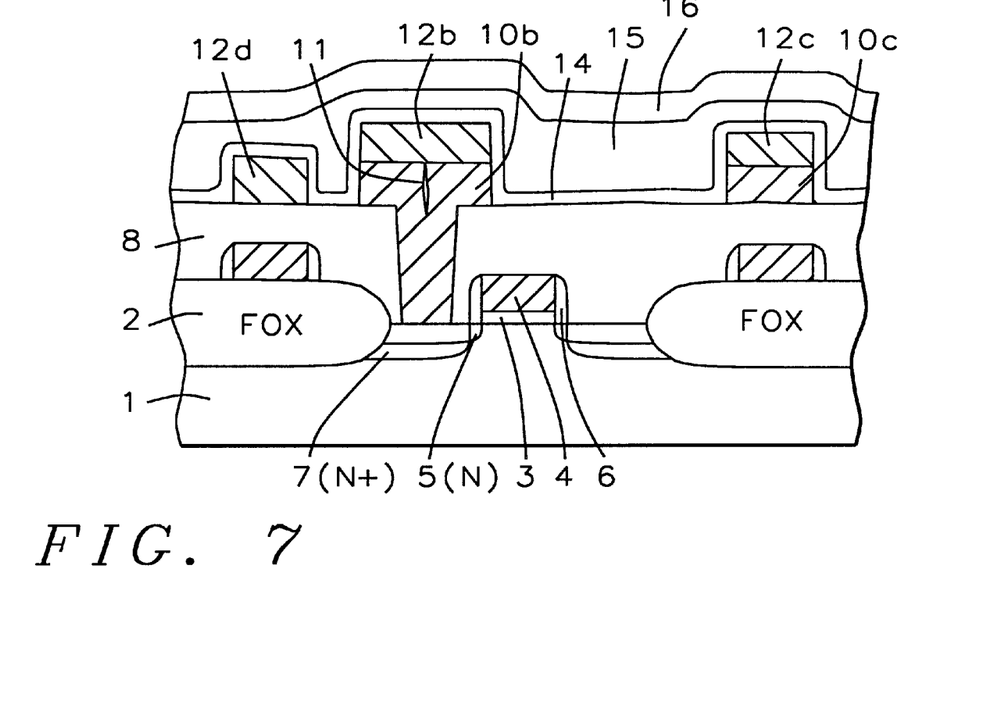
FIGS. 7–8, which schematically show the stages of processing used to fill the spaces between first level interconnect metallization structures, and between raised tungsten plug structures, using a composite insulator layer.

FIGS. 7, describes the process steps used to fill the spaces between first level interconnect metallization structures, 12b, 12c, and 12d, as well as the spaces between tungsten plug structures, 10b and 10c, with a first composite insulator layer. A first interlevel dielectric layer, 14, of silicon oxide, is deposited using PECVD processing, at a temperature between about 300 to 500° C., to a thickness between about 4000 to 8000 Angstroms. The first interlevel dielectric layer, 14, will be used to passivate and protect the first level interconnect metallization structures and tungsten plugs, form subsequent processes and materials. However first interlevel dielectric layer, 14, does not adequately fill the spaces between these metal structures, and can not produce a desired planar topography, needed for overlying metallization structures, therefore a layer of spin on glass, 15, (SOG), is applied. The porous SOG layer, 15, is applied using conventional techniques, to a thickness between about 3000 to 7000 Angstroms, and results in a more adequate fill, and planarizing layer then the less porous, underlying first interlevel dielectric layer, 14. A bake out at a temperature between about 100 to 200° C., followed by a curing procedure, at a temperature between about 250 to 450° C., are used to remove volatile components from the SOG layer, 15. Finally a second interlevel dielectric layer, 16, is deposited again using PECVD processing, at a temperature between about 300 to 500° C., to a thickness between about 6000 to 12000 Angstroms. This layer is used to completely fill the spaces between metal structures, as well as encapsulating most of the SOG layer, 15, reducing the level of outgassing from SOG layer, 15, during subsequent processing.

Figure 8:
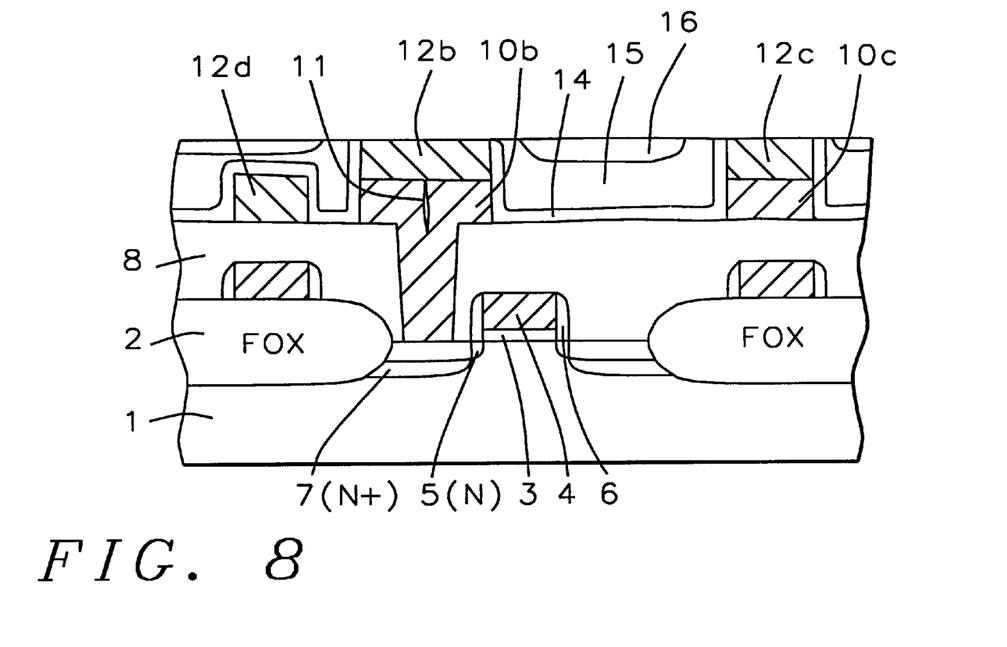

A chemical mechanical polishing procedure, using $NH_4OH$ or KOH stabilized slurry and polishing pad, is next employed to a point in which the top surface of a first level interconnect metallization structure, 12b, is exposed. This is shown schematically in FIG. 8. The chemical mechanical polishing step also provides a planar topography for subsequent overlying metallization structures. The ability to expose the top surface of first level interconnect metallization structure, 12b, allows an overlying metallization structure to contact first level interconnect metallization structure, 12b, without the difficulty of opening a via hole, in an insulator, to underlying structure, 12b. In addition, microloading effects, sometimes occurring with dry etching of via holes, is also avoided using this technique of exposing underlying metallization structures. The raised, or extended, tungsten plug structure, aided in the creation of the first level interconnect metallization structure, 12b, allowing for the elimination of the via hole opening process.

Figure 9:
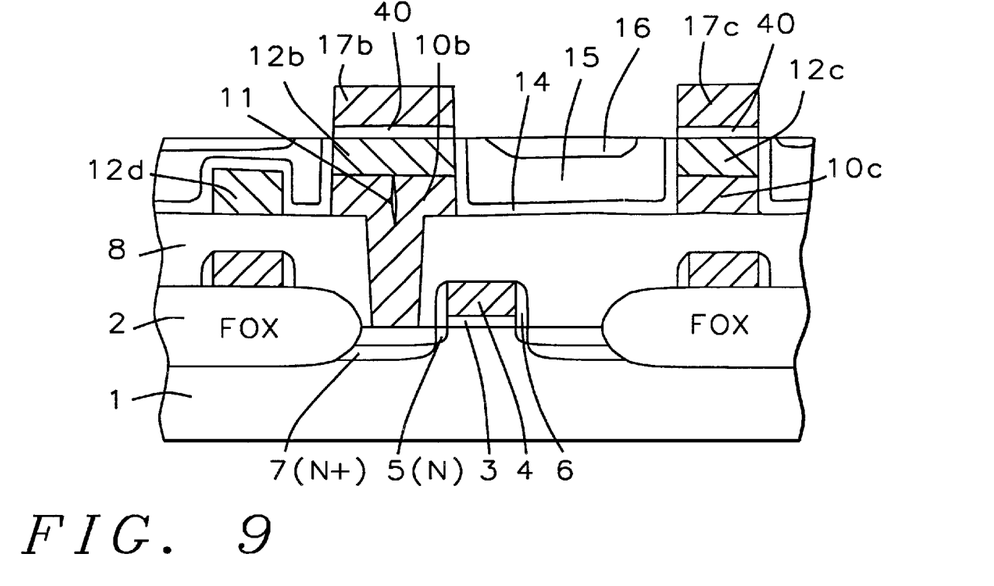
FIG. 9, which schematically shows the formation of an second level interconnect metallization structure, overlying a first level interconnect metallization structure.

A barrier layer of titanium nitride, 40, is next deposited using r.f sputtering, to a thickness between about 500 to 1000 Angstroms, followed by an insitu, r.f. sputter deposition of an aluminum layer, containing between about 0.5 to 1.0% copper, and between about 0.5 to 1.0% silicon, to a thickness between about 4000 to 10000 Angstroms. Conventional photolithographic and anisotropic, RIE processing, is used to create the second level interconnect, aluminum metallization structure, 17b, and 17c, shown in FIG. 9. Photoresist removal is accomplished again via plasma oxygen ashing and careful wet cleans. The second level interconnect metallization structure, 17b, directly contacts underlying first level interconnect metallization structure, 12b, without the use of a via structure. The width of the second level interconnect metallization structure, 17b, is identical to the width of the first level interconnect metallization structure, 12b.

Figure 6:
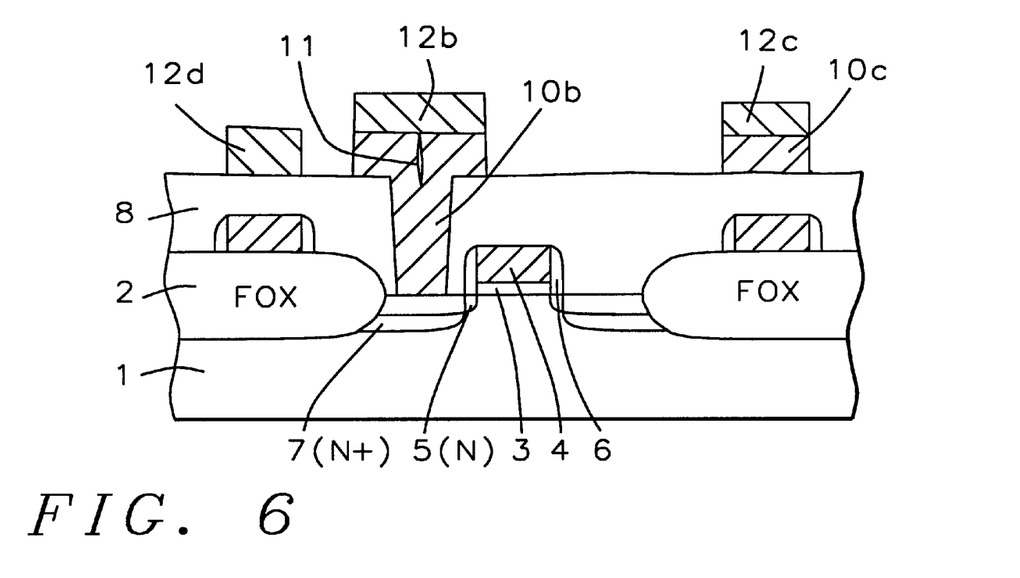
Figure 10:
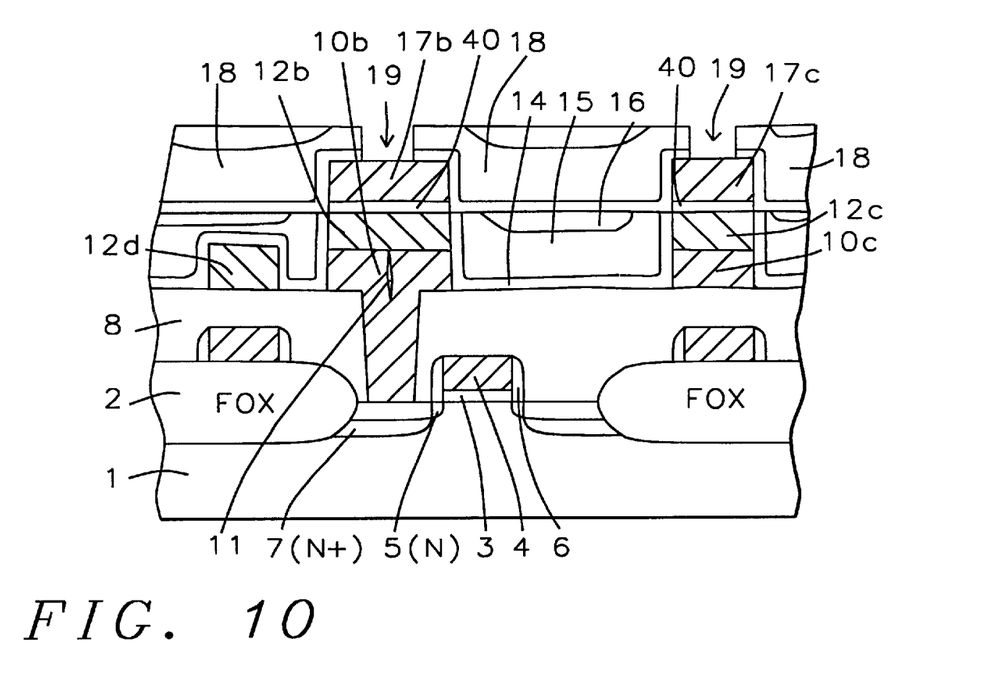
FIGS. 10–12, which schematically shows use of the raised tungsten plug structure, used for upper levels of interconnect metallization structures.

A second composite dielectric layer, 18, identical to the composite dielectric layer shown in FIG. 6, in materials, processing conditions and thicknesses is again used to fill spaces between second level interconnect metallization structures, 17b and 17c. A chemical mechanical polishing procedure, again using $NH_4OH$ or KOH stabilized slurry and polishing pad, is used to planarize second composite dielectric layer, 18, however not exposing the top surface of second level interconnect metallization structures, 17b and 17c. A photolithographic and RIE procedure, using $CHF_3$ as an etchant, is used to open via hole, 19, in second composite dielectric layer, 18, exposing the top surface of second level interconnect metallization structures, 17b, and 17c. Photoresist removal is accomplished using plasma oxygen ashing and careful wet cleans. This is shown schematically in FIG. 10.

Figure 11:
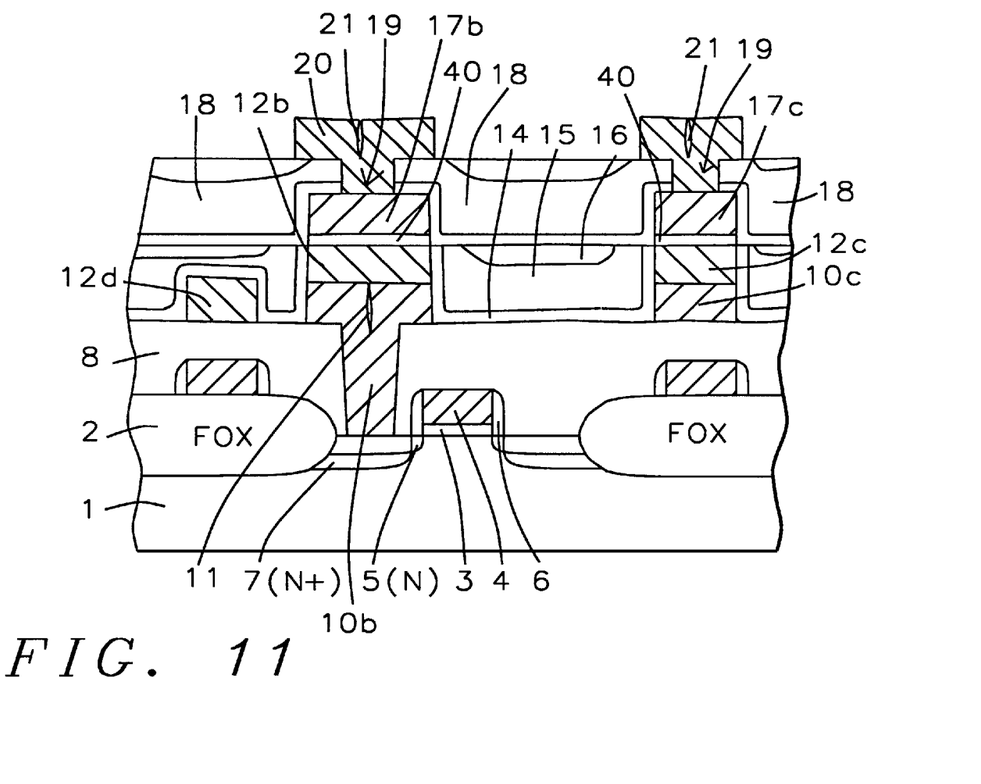

A tungsten layer is next deposited using LPCVD processing, at a temperature between about 400 to 600° C., to a thickness between about 8000 to 14000 Angstroms, using tungsten hexafluoride as a source. Photolithographic and anisotropic, RIE procedures, using $SF_6$ as an etchant, are employed to create tungsten plug, 20, shown in FIG. 11. Also shown in FIG. 11, is seam 21, formed during the deposition of the tungsten layer, but not enlarged due to the masking provided during the tungsten etchback procedure. Tungsten plug, 20, again as was the case for underlying tungsten plug, 12b, is raised or extended, allowing contact between subsequent upper level interconnect metallization structures to occur, without the use of via hole processing. Photoresist removal of the shape used as a mask to define tungsten plug, 20, is accomplished via plasma oxygen ashing, and careful wet cleans.

Figure 12:
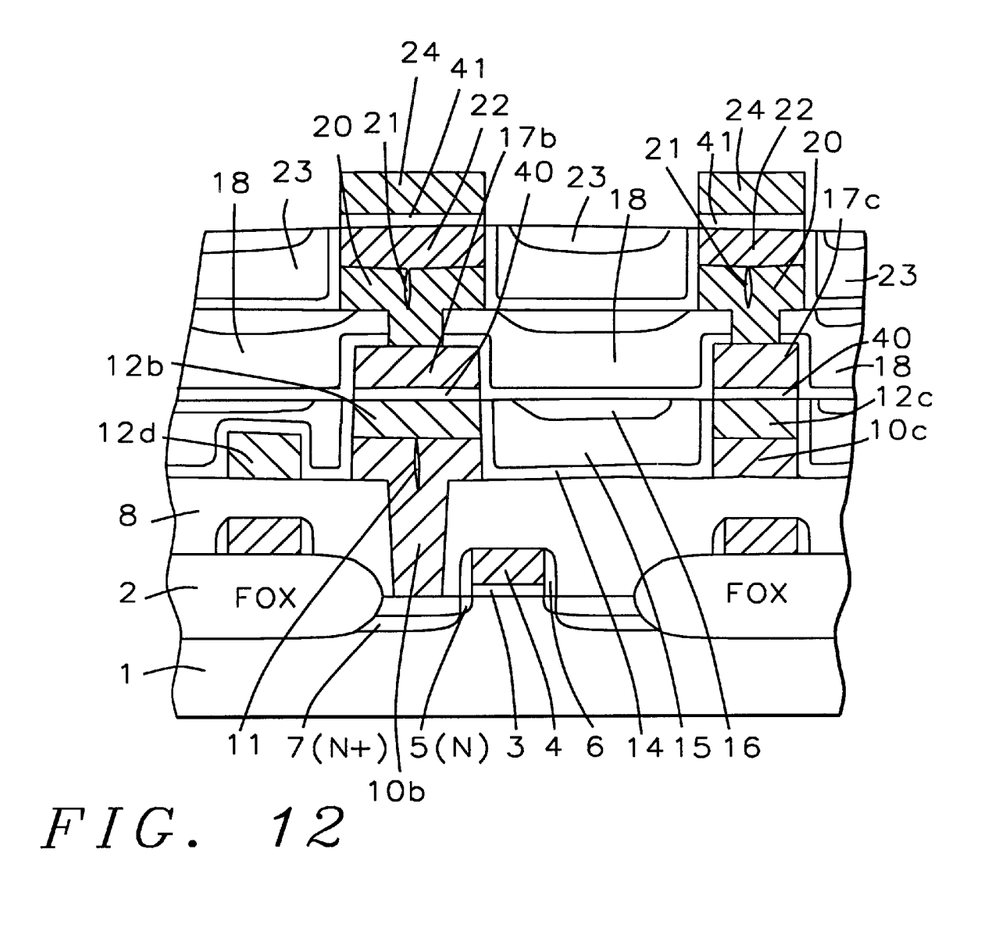

FIG. 12, shows the result of depositing another aluminum based metallization layer, and via use of standard photolithographic and anisotropic, RIE procedures, creating a third level interconnect metallization structure, 22, overlying the raised tungsten plug structure, 20, and identical in width to raised tungsten plug structure, 20. Photoresist removal is again performed using plasma oxygen ashing and careful wet cleans. This is shown schematically in FIG. 12. A third composite insulator layer, 23, again identical to the first and second composite insulator layers, in materials, processing conditions, and thicknesses, is used to fill the spaces between the third level interconnect metallization structures, 22, as well as filling the spaces between raised tungsten plug structures, 20. Chemical mechanical polishing procedures, using $NH_4OH$ or KOH stabilized silica slurry, is used to planarize third composite insulator layer, 23, to a point in which the top surface of the third level interconnect metallization structure, 22, is exposed. This is shown schematically in FIG. 12. Finally another deposition of a barrier layer of titanium nitride, 41, at a thickness of between about 500 to 1000 Angstroms, followed by the deposition of a aluminum based metallization layer, to a thickness between about 4000 to 10000 Angstroms, and containing between 0.5 to 1.0% copper, and between about 0.5 to 1.0% silicon, is performed using r.f. sputtering procedures. Creation of a fourth interconnect metallization structure, 24, is next accomplished via standard photolithographic and RIE processing, again without the use of via hole processing. Photoresist is again removed via plasma oxygen ashing, followed by careful wet cleans.

This process for creating raised tungsten plug structures, allowing contact between levels of interconnect metallization structures to occur without via hole formation, although shown as an application for N channel, (NFET), devices, can also be applied to P channel, (PFET), devices, complimentary, (CMOS), devices, as well as to BiCMOS devices.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, on a semiconductor substrate, comprising:

field oxide regions on the surface of said semiconductor substrate;

a device region between said field oxide regions;

a polysilicon gate structure on said semiconductor substrate, in center of said device region;

a source/drain region in said semiconductor substrate, between said polysilicon gate structure and said field oxide region;

an insulator layer, with a planar top surface topography, located on said source/drain region, located on said polysilicon gate structure, and located on said field oxide regions;

a contact hole, in said insulator layer, to a source region, of said source/drain region;

a metal plug structure, comprised of a first portion of said metal plug structure, located entirely in said contact hole, and comprised with a second portion of said metal plug structure, overlying said first portion of said metal plug structure, and overlying a portion of said insulator layer;

a first interconnect metallization structure, directly overlying said metal plug structure, with the width of said first interconnect metallization structure equal to the width of said second portion of said metal plug structure;

a composite insulator layer, with a planar top surface topography, overlying said first insulator layer, in regions in which said first insulator layer is not covered by said metal plug structure, and with the top surface of said composite insulator layer at the same level as the top surface of said first interconnect metallization structure; and a second interconnect metallization structure, and an underlying barrier layer, directly overlying said first interconnect metallization structure, with the width of said second interconnect metallization structure equal to the width of said first interconnect metallization structure.

2. The MOSFET device structure of claim 1, wherein said metal plug structure, is composed of tungsten, extending above top surface of said insulator layer by between about 8000 to 14000 Angstroms.

3. The MOSFET device structure of claim 1, wherein said first interconnect metallization structure, is composed of aluminum, containing between about 0.5 to 1.0% copper, and between about 0.5 to 1.0% silicon, formed to a thickness between about 4000 to 10000 Angstroms.

4. The MOSFET device structure of claim 1, wherein said composite insulator layer is composed of: an underlying, first silicon oxide layer, at a thickness between about 4000 to 8000 Angstroms; a spin on glass layer, at a thickness between about 3000 to 7000 Angstroms; and an overlying silicon oxide layer, at a thickness between about 6000 to 12000 Angstroms.

* * * * *